United States Patent
Kim et al.

(10) Patent No.: US 9,514,402 B1
(45) Date of Patent: Dec. 6, 2016

(54) RADIO FREQUENCY IDENTIFICATION (RFID) TAG HAVING MULTIPLE ANTENNAS

(71) Applicant: Electronics and Telecommunications Research Institute, Daejeon-si (KR)

(72) Inventors: Hyun Seok Kim, Jeonju-si (KR); Chan Won Park, Daejeon-si (KR)

(73) Assignee: ELECTRONICS AND TELECOMMUNICATIONS RESEARCH INSTIT, Daejeon-Si (KR)

( * ) Notice: Subject to any disclaimer, the term of this patent is extended or adjusted under 35 U.S.C. 154(b) by 0 days.

(21) Appl. No.: 14/947,750

(22) Filed: Nov. 20, 2015

(30) Foreign Application Priority Data

Aug. 5, 2015 (KR) ........................ 10-2015-0110683

(51) Int. Cl.
| G06F 19/00 | (2011.01) |
| G06K 19/077 | (2006.01) |
| H01Q 1/22 | (2006.01) |
| G06K 19/073 | (2006.01) |
| H03C 1/08 | (2006.01) |

(52) U.S. Cl.
CPC ....... G06K 19/07794 (2013.01); G06K 19/073 (2013.01); H01Q 1/2225 (2013.01); H03C 1/08 (2013.01)

(58) Field of Classification Search
CPC .............. G06K 7/0008; G06K 7/10069; G06K 7/10306; G01S 13/756; G01S 13/878; G07B 15/063; G08G 1/017; H01Q 3/2647; H01Q 3/46; H04B 1/38
USPC ................ 235/385, 492, 486, 487, 375, 380
See application file for complete search history.

(56) References Cited

U.S. PATENT DOCUMENTS

| 5,649,296 A | * | 7/1997 | MacLellan | G06K 7/0008 340/7.1 |
| 6,243,013 B1 | | 6/2001 | Duan et al. | |
| 7,595,729 B2 | | 9/2009 | Ku et al. | |
| 2006/0103535 A1 | * | 5/2006 | Pahlaven | G06K 7/10306 340/572.1 |
| 2008/0278293 A1 | * | 11/2008 | Drucker | G06K 7/0008 340/10.4 |

(Continued)

FOREIGN PATENT DOCUMENTS

KR    100732681 B1    6/2007

OTHER PUBLICATIONS

Pavel V. Nikitin et al., "Performance of RFID Tags with Multiple RF Ports," Antennas and Propagation Society International Symposium, Jun. 2007, pp. 5459-5462, IEEE.

(Continued)

Primary Examiner — Thien M Le
(74) Attorney, Agent, or Firm — William Park & Associates Ltd.

(57) ABSTRACT

Provided is a Radio Frequency Identification (RFID) tag having a plurality of antennas. The RFID tag includes: a plurality of antennas each configured to backscatter received Radio Frequency (RF) signals; a digital and memory circuitry, which once the RF signals are received through the plurality of antennas, is configured to generate a series of programmed encoding signals based on identification information to be transmitted, and to output the generated signals; and a modulator configured to vary power of an uplink signal backscattered through the plurality of antennas based on the encoding signals input from the digital and memory circuitry, in which the modulator operates such that the power of the uplink signal backscattered through each of the plurality of antennas is equal regardless of types of the encoding signals.

16 Claims, 4 Drawing Sheets

(56) References Cited

U.S. PATENT DOCUMENTS

| | | | |
|---|---|---|---|
| 2009/0058657 A1* | 3/2009 | Tuttle | G06K 7/10316 340/572.7 |
| 2011/0072132 A1* | 3/2011 | Shafer | G06Q 10/087 709/224 |
| 2011/0156874 A1* | 6/2011 | Liu | G06K 7/10346 340/10.1 |
| 2013/0147609 A1* | 6/2013 | Griffin | G06K 7/10158 340/10.5 |
| 2014/0145832 A1* | 5/2014 | Kim | G06K 19/07786 340/10.5 |

OTHER PUBLICATIONS

Joshua D. Griffin et al., "Gains for RF Tags Using Multiple Antennas," IEEE Transactions on Antennas and Propagation, Feb. 2008, pp. 563-570, vol. 56, No. 2, IEEE.

"Monza 4 Tag Chip Datasheet," Mar. 24, 2014, pp. 1-33, Impinj, Inc.

Hsin-Chin Liu, et al., "Passive UHF RFID Tag With Backscatter Diversity", IEEE Antennas and Wireless Propagation Letters, Oct. 2011, pp. 415-418, vol. 10, IEEE.

Colby Boyer et al., "Space Time Coding for Backscatter RFID", IEEE Transactions on Wireless Communications, May 2013, pp. 2272-2280, vol. 12, No. 5, IEEE.

Sang-Hyun Mo et al., "Modeling and Simulation of New Encoding Schemes for High-Speed UHF RFID Communication", ETRI Journal, Apr. 2015, pp. 241-250, vol. 37, No. 2, ETRI.

"EPC Radio-Frequency Identity Protocols Class-1 Generation-2 UHF RFID Protocol for Communications at 860 MHz—960 MHz Version 1.2.0", Specification for RFID Air Interface, Oct. 23, 2008, pp. 1-108, EPCglobal Inc.

Hyunseok Kim et al., "Dual balanced backscattering modulator for dual-antenna tag", Electronics Letters, Nov. 21, 2014, pp. 1-4.

* cited by examiner

RADIO FREQUENCY IDENTIFICATION (RFID) TAG HAVING MULTIPLE ANTENNAS

CROSS-REFERENCE TO RELATED APPLICATION(S)

This application claims priority from Korean Patent Application No. 10-2015-0110683, filed on Aug. 5, 2015, in the Korean Intellectual Property Office, the entire disclosure of which is incorporated herein by reference for all purposes.

BACKGROUND

1. Field

The following description generally relates to a technology for Radio Frequency IDentification (RFID), and more particularly to a technology for RFID tags which has multiple antennas to provide uplink communications through wireless communications of a backscatter modulation scheme.

2. Description of the Related Art

Radio Frequency IDentification (RFID) is a wireless technology to read or record information on tags by using radio frequencies, and is used to identify, track, or manage tagged items, animals, or people. Such RFID system has unique identification information, and is composed of a transponder or an RFID tag attached to objects or people, an interrogator or an RFID reader to read information on an RFID tag or write information thereon, a database, a network, and the like.

In the RFID system, the RFID reader transmits an RF signal with a carrier signal to the RFID tag, and the RFID tag generates its own power by using the carrier signal received from the RFID reader, uses the power to transmit information, generated by encoding and modulating stored data, as an uplink signal to the RFID reader. Such wireless communication in the RFID system is called a backscatter modulation, which is mainly used in a passive or semi-passive RFID system in an Ultra High Frequency (UHF) range of 860 MHz to 960 MHz.

The RFID tag is generally provided with a small flexible antenna to be easily attached to products. However, it is known that when facing a channel environment such as multipath fading, the UHF-band RFID system may increase recognition errors, that is, may reduce a recognition rate. In order to overcome the drawbacks, a method of using two or more antennas with an orthogonal polarization has been proposed. For example, an RFID tag with two antennas may doubly harvest DC power from electromagnetic waves of an RFID reader in downlink, and may doubly backscatter information in uplink. As a result, better performance in terms of a recognition rate, orientation sensitivity, and the like, may be achieved when compared with a single antenna RFID tag.

Further, in the case of using a multiple antenna RFID tag with two or more antennas, Multiple Input and Multiple Output (MIMO), space-time block codes (STBC), dual-speed Amplitude Shift Keying (ASK), and the like may be applied. In these schemes, information is transmitted by changing either or both of amplitudes and phases of an uplink signal transmitted by backscattering, such that the schemes may improve the speed of uplink communications.

However, in order to improve the speed in uplink communications in the RFID system while preventing reduction in a recognition rate, multiple antennas should be in an almost similar environment of electromagnetic waves, but in practice it is impossible that antennas are in the same or similar environment of electromagnetic waves all the time. For this reason, some data may be lost during transmission, resulting in recognition errors of an uplink signal. For example, in the case where a specific antenna, among a plurality of antennas, is in a bad environment of electromagnetic waves, an RFID reader may not accurately recognize an uplink signal transmitted by an RFID tag, or may mistakenly recognize an uplink signal as some other signal. Even when the speed of uplink communications is increased by using a new technology, it is undesirable that a recognition rate of an uplink signal is reduced.

SUMMARY

Provided is a Radio Frequency Identification (RFID) tag with multiple antennas, which may prevent reduction in a recognition rate of an uplink signal even when the antennas are in different radio wave environments.

The RFID tag with multiple antennas may prevent reduction in a recognition rate of an uplink signal even when a specific antenna is in a bad radio wave environment.

In the RFID tag with two antennas, even when the antennas are in different radio wave environments, an equal uplink signal may be transmitted with respect to encoding signals '01' and '10'.

In one general aspect, there is provided a Radio Frequency Identification (RFID) tag, including: a plurality of antennas each configured to backscatter received Radio Frequency (RF) signals; a digital and memory circuitry, which once the RF signals are received through the plurality of antennas, is configured to generate a series of programmed encoding signals based on identification information to be transmitted, and to output the generated signals; and a modulator configured to vary power of an uplink signal backscattered through the plurality of antennas based on the encoding signals input from the digital and memory circuitry, in which the modulator operates such that the power of the uplink signal backscattered through each of the plurality of antennas is equal regardless of types of the encoding signals.

The modulator may operate to vary the power of the uplink signal backscattered through the plurality of antennas according to the input encoding signals.

The modulator may be connected with each of the plurality of antennas, and may include a plurality of variable impedance circuits having different impedances. Each of the plurality of variable impedance circuits may include: a plurality of additional impedance elements, which have different values from each other and are capable of being connected in parallel to a base impedance element of the tag; and a switching device configured to control each of the plurality of additional impedance elements to be connected to the base impedance element.

An Amplitude Shift Keying (ASK) modulation scheme may be applied to the modulator. In this case, the plurality of antennas may be two in number, and the encoding signals may be 2-bit signals.

The modulator may include two variable impedance circuits which are connected to each of the two antennas to vary the power of the uplink signal backscattered through the plurality of antennas according to the input encoding signals. Each of the two variable impedance circuits include: two additional impedance elements, which have different values from each other and are capable of being connected in parallel to a base impedance element of the tag; and a switching device configured to control each of the two additional impedance elements to be connected to the base impedance element. More specifically, in response to the encoding signal being '01' or '10', the switching device may control a first additional impedance element, among the two additional impedance elements, to be connected in parallel with the base impedance element. Further, in response to the encoding signal being '11', the switching device may control a second impedance element, among the two additional impedance elements, to be connected in parallel with the base impedance element.

In another general aspect, there is provided a Radio Frequency Identification (RFID) tag with a plurality of antennas, the tag including: a first antenna and a second antenna each configured to backscatter respective received Radio Frequency (RF) signals; a modulator configured to comprises a first unit modulation circuitry configured to be electrically connected to the first antenna to vary power of an uplink signal backscattered through the first antenna, and a second unit modulation circuitry configured to be electrically connected to the second antenna to vary power of an uplink signal backscattered through the second antenna; and a digital and memory circuitry, which once the RF signals are received through the first and the second antennas, is configured to generate a series of encoding signals with identification information to be transmitted being encoded therein, and to output the generated signals, in which the modulator operates such that the power of the uplink signal backscattered through each of the first and the second antennas is equal regardless of types of the encoding signals.

An Amplitude Shift Keying (ASK) modulation scheme may be applied to the modulator. In this case, each of the first and the second unit modulation circuitries may include two variable impedance circuits to vary the power of the uplink signal backscattered through the first and the second antennas according to input encoding signals.

Each of the two variable impedance circuits may include: two additional impedance elements, which have different values from each other and are capable of being connected in parallel to a base impedance element of the tag; and a switching device configured to control each of the two additional impedance elements to be connected to the base impedance element. In this case, in response to the encoding signal being '01' or '10', the switching device may control a first additional impedance element, among the two additional impedance elements, to be connected in parallel with the base impedance element. Further, in response to the encoding signal being '11', the switching device may control a second impedance element, among the two additional impedance elements, to be connected in parallel with the base impedance element.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness. Terms used throughout this specification are defined in consideration of functions according to exemplary embodiments, and can be varied according to a purpose of a user or manager, or precedent and so on. Accordingly, the terms used in the following embodiments conform to the definitions described specifically in the present disclosure, and unless particularly defined otherwise, the terms should be interpreted as having the same meaning as commonly understood by one of ordinary skill in the art to which this invention pertains.

Figure 1:
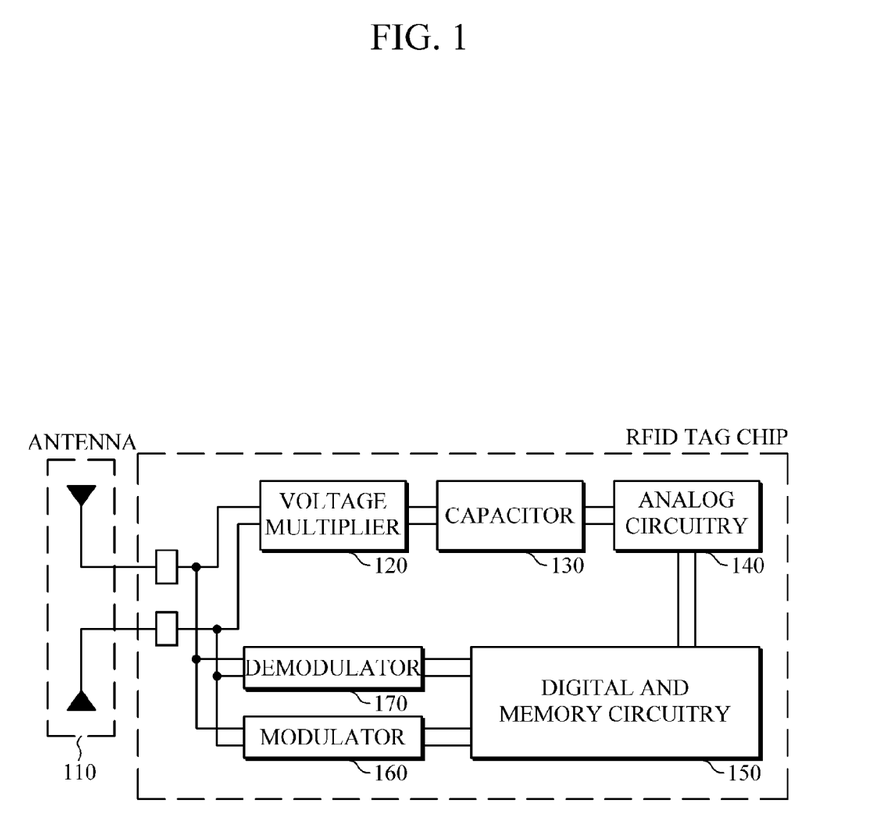
FIG. 1 is a block diagram illustrating a passive RFID tag with two antennas.

FIG. 1 is a block diagram illustrating a passive RFID tag with two antennas. The RFID tag illustrated in FIG. 1 may be a general passive RFID tag working at the Ultra High Frequency (UHF) band. Referring to FIG. 1, the RFID tag includes an antenna 110, a voltage multiplier 120, a capacitor 130, an analog circuitry 140, a digital and memory circuitry 150, and a modulator 160. The RFID tag may further include a demodulator 170 as an optional component.

The antenna 110 receives an electromagnetic radio frequency signal radiated from an RFID reader (not shown) or transmits an uplink signal by backscattering modulation. The antenna 110 is connected with the voltage multiplier 120, the modulator 160, and the demodulator 170.

The voltage multiplier 120 converts power of the radio frequency signal received from the RFID reader through the antenna 110, i.e., converts alternating current (AC) power into power necessary to operate an RFID tag chip, i.e., direct current (DC) power. Further, the DC power converted by the voltage multiplier 120 is stored in the capacitor 130. The DC power stored by the capacitor 130 may be used by the analog circuitry 140, the digital and memory circuitry 150, and the like, in which the analog circuitry 140 includes analog circuits commonly included to operate an RFID tag chip, and refers to analog circuits other than an analog circuit that includes the capacitor 130, the modulator 160, and the demodulator 170.

The digital and memory circuitry 150 stores unique data necessary for identification of RFID tags. In response to a downlink signal received from the RFID reader through the antenna 110, the digital and memory circuitry 150 performs programming of information to be transmitted corresponding to stored data, generates a series of encoding signals according to a programming result, and outputs the generated signals. The output encoding signals are transmitted to the modulator 160. In the following description, "a series of encoding signals" refer to information generated by the digital and memory circuitry 150 and transmitted to the modulator 160, and all the information to be transmitted to an RFID reader. In the case of an RFID tag with two antennas, a series of encoding signals, transmitted from the digital and memory circuitry 150 to the modulator 160, are split into four types of encoding signals '00', '01', '10', and '11', which are 2-bit data.

Further, the digital and memory circuitry 150 may decode a demodulated downlink signal transmitted from the demodulator 170, and may generate an encoding signal in response to the decoded downlink signal, or may store decoded data if necessary. To this end, the demodulator 170 demodulates a downlink signal in electromagnetic waves received from an RFID reader, and transmits the demodulated downlink signal to the digital and memory circuitry 150. As described above, according to an RFID system architecture, the RFID tag may not include the demodulator 170.

The modulator 160 is a backscattering modulator which may vary degrees of backscattering through the antenna 110 according to an encoding signal input from the digital and memory circuitry 150. As a result, the RFID tag may transmit, through the antenna 110, an uplink signal of different phases and/or amplitudes depending on the types of encoding signals '00', '01', '10', and '11'. Accordingly, in the passive RFID system that enables communications by backscattering modulation, phases and/or amplitudes of an uplink signal transmitted through the antenna 110 may be changed according to encoding signals input to the modulator 160.

Figure 2:
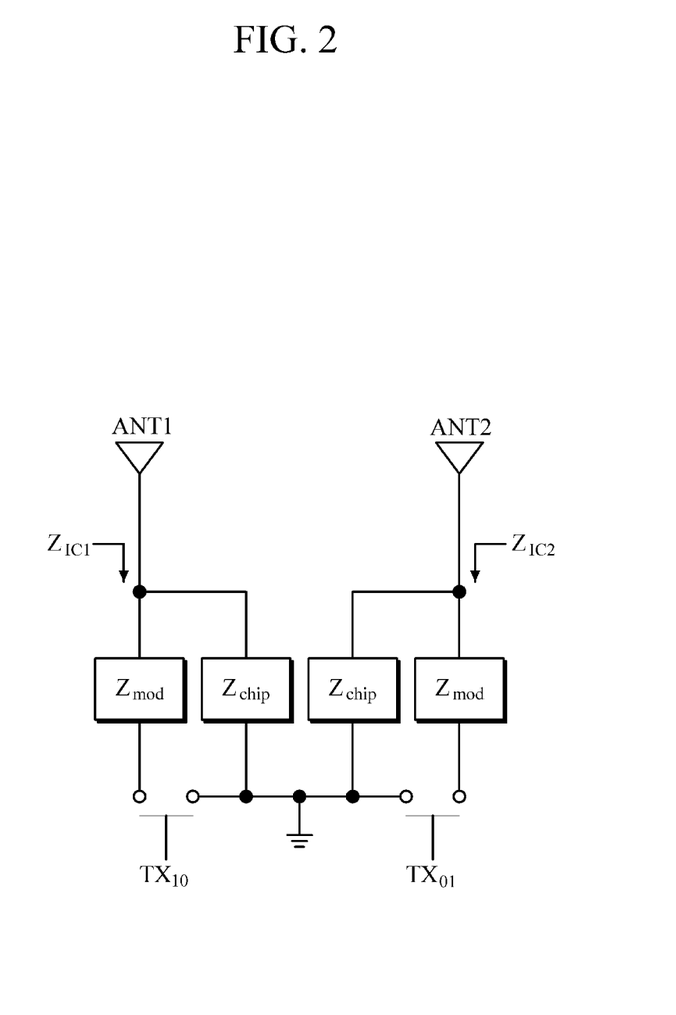
FIG. 2 is a diagram illustrating an example of an existing dual backscattering modulator.

FIG. 2 is a diagram illustrating an example of an existing dual backscattering modulator.

Referring to FIG. 2, in the dual backscattering modulator, a base impedance $Z_{chip}$ is connected in parallel with an additional impedance $Z_{mod}$ which induces an impedance mismatch between antennas ANT1 and ANT2 and a chip. The RFID tag including such dual backscattering modulator operates in the following manner.

When the tag works in downlink, both transmission signals $TX_{10}$ and $TX_{01}$ are 0, and thus tag input impedances $Z_{IC1}$ and $Z_{IC2}$ of a unit modulation circuitry connected to each of the antennas ANT1 and ANT2 are equally the base impedance $Z_{chip}$. Since each of the antennas ANT1 and ANT2 is designed to be $Z_{chip}$, power arrived at each of the antennas ANT1 and ANT2 is mostly transferred to a tag chip.

By contrast, when the tag works in uplink, two switches may be activated by the transmission signals $TX_{10}$ and $TX_{01}$, which are digital data encoded by the digital and memory circuitry 150. The 'transmission signals' $TX_{10}$ and $TX_{01}$ function as control bits to control whether switches are activated for each of the antennas ANT1 and ANT2. Accordingly, each of the tag input impedances $Z_{IC1}$ and $Z_{IC2}$ may be any one of $Z_{chip}$ and $Z_{mod}//Z_{chip}$. For example, if the transmission signals $TX_{10}$ and $TX_{01}$ are '0', the tag input impedances $Z_{IC1}$ and $Z_{IC2}$ are $Z_{chip}$, while the transmission signals $TX_{10}$ and $TX_{01}$ are '1', the tag input impedances $Z_{IC1}$ and $Z_{IC2}$ may be $Z_{mod}//Z_{chip}$. Operations of such dual backscattering modulator are shown in Table 1 below.

TABLE 1

| TX10 | TX01 | $Z_{IC1}$ | $Z_{IC2}$ |
|---|---|---|---|
| 0 | 0 | Zchip | Zchip |
| 1 | 0 | Zmod//Zchip | Zchip |
| 0 | 1 | Zchip | Zmod//Zchip |
| 1 | 1 | Zmod//Zchip | Zmod//Zchip |

Power backscattered by the reflection coefficient between $Z_{chip}$ and $Z_{mod}//Z_{chip}$ is ideally increased by 3-dB when compared with a single-antenna RFID tag. However, in such modulator, if a dual antenna is in a different radio wave environment, an uplink signal transmitted from the RFID tag to the RFID reader is distorted, resulting in recognition errors.

Hereinafter, recognition errors occurring due to different radio wave environments of antennas will be described in detail by using, as a dual-antenna RFID tag, an RFID system of an Amplitude Shift Keying (ASK) modulation scheme.

As described above, in the dual-antenna RFID tag, four types of encoding signals '00', '01', '10', and '11' may be input bit by bit to a modulator as transmission signals $TX_{10}$ and $TX_{01}$. The simplest method in the dual ASK modulation scheme is to maximize (M) or minimize (m) backscattered power in each antenna depending on whether the transmission signals $TX_{10}$ and $TX_{01}$ are '0' or '1'. When encoding signals '00', '01', '10', and '11' are input to a modulator as the transmission signals $TX_{10}$ and $TX_{01}$, the backscattered power may be mm-mM-Mm-MM. In this case, the RFID reader receives uplink signals of only three types '00', '01' or '10', and '11', since the RFID reader recognizes uplink signals according to power intensity of backscattered radio frequency signals. However, the RFID reader may differentiate between signals '01' and '10', having the same power intensity, according to a predetermined protocol in the RFID system.

In the RFID system using the RFID tag having the modulator illustrated in FIG. 2, recognition errors may occur in the RFID reader if a dual antenna is in a different radio wave environment. For example, if a second antenna ANT2 is in a relatively bad radio wave or reception environment as compared to a first antenna ANT1, the RFID reader may not accurately sense a signal power backscattered through the second antenna ANT2. As a result, when encoding signals '00', '01', '10', and '11' are input to a modulator as transmission signals $TX_{10}$ and $TX_{01}$, the backscattered power sensed by the RFID reader is mm-mm-Mm-Mm, thereby occurring a recognition error.

Figure 3:
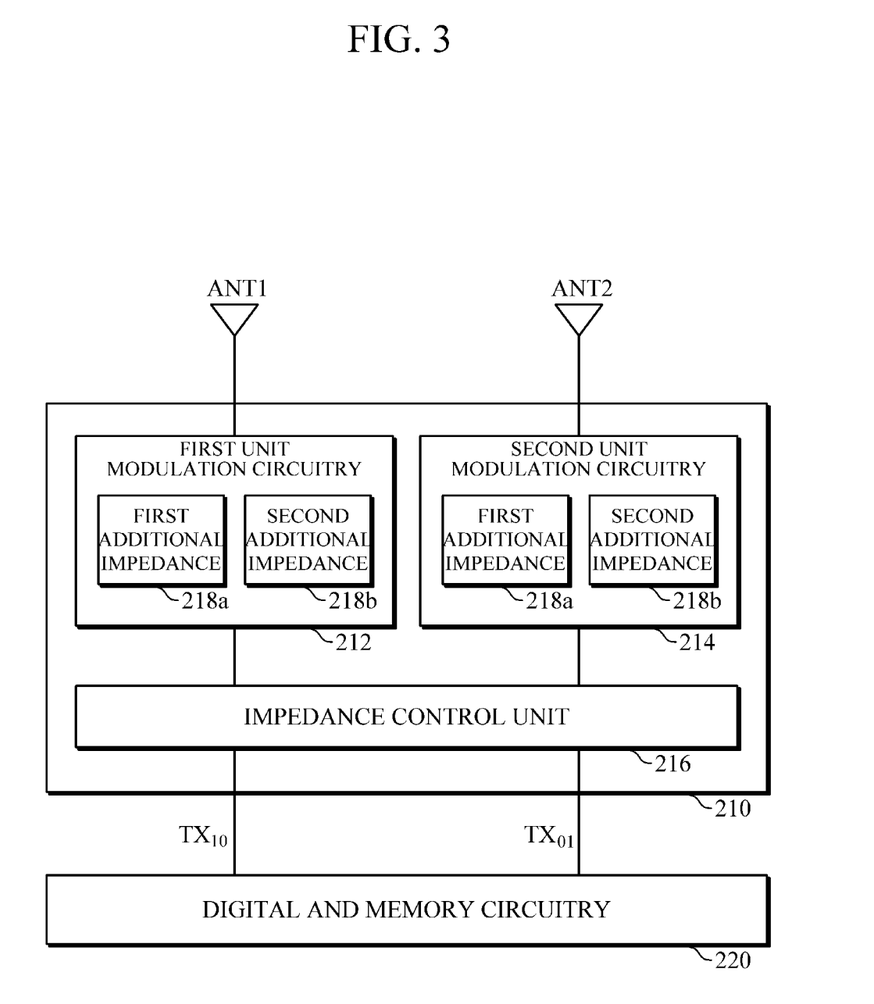
FIG. 3 is a block diagram illustrating a dual antenna RFID tag according to an exemplary embodiment.

FIG. 3 is a block diagram illustrating a dual antenna RFID tag according to an exemplary embodiment.

Referring to FIG. 3, the RFID tag includes two antennas ANT1 and ANT2, a modulator 210, and a digital and memory circuitry 220. Although the RFID tag includes two antennas in FIG. 3, the example is merely illustrative, and the RFID tag may include three or more antennas. Further, in the case where the RFID tag includes three or more antennas, the modulator 210 may include as many unit modulation circuitries as the number of antennas. The internal impedance of two antennas ANT1 and ANT2 is designed to be $Z_{chip}$, in which $Z_{chip}$ is a base impedance, and a tag input impedance in the case where the transmission signals $TX_{10}$ and $TX_{01}$ input to the modulator 210 are '0'.

The modulator 210 may vary degrees of backscattering through two antennas ANT1 and ANT2 according to encoding signals input from the digital and memory circuitry 250. To this end, the modulator 210 includes two unit modulation circuitries 212 and 214, each of which is connected to two antennas ANT1 and ANT2, and each of the unit modulation circuitries 212 and 214 includes a variable impedance circuit. The unit modulation circuitries 212 and 214 are configured in the same manner, in which each of the unit modulation circuitries 212 and 214 may include two additional impedances of different values, in addition to a base impedance of a chip. For example, the first unit modulator 212 includes a first additional impedance 218a and a second additional impedance 218b, and the second unit modulator 214 may also include the first additional impedance 218a and the second additional impedance 218b.

In addition, the modulator 210 operates to control signal power backscattered through each of the antennas ANT1 and ANT2 to be identical regardless of the types of encoding signals transmitted from the digital and memory circuitry 220. That is, the modulator 210 controls all the impedances, i.e., tag input impedances, of the unit modulation circuitries 212 and 214 to be identical regardless of encoding signals. More specifically, the modulator 210 controls tag input impedances of the unit modulation circuitries 212 and 214, so that signal power backscattered through the first antenna ANT1 and signal power backscattered through the second antenna ANT2 may be the same.

Further, the modulator 210 operates to control the power of uplink signal backscattered through both antennas ANT1 and ANT2 to be different according to encoding signals transmitted from the digital and memory circuitry 220. For example, in the case where an encoding signal is '00', the modulator 210 may control all the impedances of each of the unit modulation circuitries 212 and 214 to be $Z_{chip}$, which is a base impedance (in this case, no additional impedance is connected to the base impedance), and in the case where an encoding signal is '01' or '10', the modulator 210 may control all the impedances of each of the unit modulation circuitries 212 and 214 to be $Z_{chip}//Z_{mod1}$ (in this case, $Z_{mod1}$ is the first additional impedance 218a connected in parallel with the base impedance circuit $Z_{chip}$). Further, in the case where an encoding signal is '11', the modulator 210 may control all the impedances of each of the unit modulation circuitries 212 and 214 to be $Z_{chip}//Z_{mod2}$ (in this case, $Z_{mod2}$ is the second additional impedance 218b connected in parallel with the base impedance circuit $Z_{chip}$). In this case, the value of the first additional impedance $Z_{mod1}$ and that of the second additional impedance $Z_{mod2}$ are different, such that signal power backscattered through the antennas ANT1 and ANT2 in the case of the first tag input impedance ($Z_{chip}//Z_{mod1}$) and signal power backscattered through the antennas ANT1 and ANT2 in the case of the second tag input impedance ($Z_{chip}//Z_{mod2}$) are different.

To this end, the first variable impedance 218a and the second variable impedance 218b included in each of the unit modulation circuitries 212 and 214 may enable additional impedances of different sizes to be connected to the base impedance according to encoding signals. For example, the first unit modulation circuitry 212 and the second unit modulation circuitry 214 may include a plurality of switching devices that may vary values of the additional impedances 218a and 218b based on encoding signals. Each of the switching devices may include a transistor device that may enable any one of the additional impedances 218a and 218b to be connected to the base impedance in the case where the transistor device is switched on. However, the embodiment is merely exemplary.

The digital and memory circuitry 220 may allocate encoding signals transmitted to the modulator 210 as a plurality of 1-bit transmission signals to control on/off of the switching devices. For example, the digital and memory circuitry 220 may sequentially allocate 2-bit encoding signals '00', '01', '10', and '11', which are to be transmitted to the modulator 210, as the first transmission signal $TX_{10}$ and the second transmission signal $TX_{01}$.

As described above, although tag input impedances of unit modulation circuitries 212 and 214 are identical regardless of the types of encoding signals, the modulator 210 vary the values of tag input impedances according to encoding signals. For example, each of the unit modulation circuitries 212 and 214 may include circuits in which additional impedances connected with the base impedance vary such that the values of the tag input impedances may be changed according to encoding signals. To this end, the modulator 210 may include an impedance control unit 216. In the exemplary embodiment, only the impedance control unit 216 in the modulator 210 is illustrated for the sake of clarification and convenience of explanation, but in practice, the impedance control unit 216 may be configured to function as an element included in all the functions of the modulator 210.

In the exemplary embodiment, in the case where an encoding signal is '00', and '0' is allocated to both the first transmission signal $TX_{01}$ and the second transmission signal $TX_{02}$, the impedance control unit 216 controls tag input impedances of each of the unit modulation circuitries 212 and 214 to be identical to the base impedance, which is known in the art. As a result, the RFID tag may maintain impedance matching between impedance of each of the antennas ANT1 and ANT2 and tag input impedance of each of the unit modulation circuitries 212 and 214.

Further, in the case where an encoding signal is '01' (in the case where '0' is allocated to the first transmission signal $TX_{10}$, and '1' is allocated to the second transmission signal $TX_{01}$), as well as in the case where an encoding signal is '10' (in the case where '1' is allocated to the first transmission signal $TX_{10}$, and '0' is allocated to the second transmission signal $TX_{01}$), the impedance control unit 216 controls both the tag input impedances of the unit modulation circuitries 212 and 214 to be the base impedance connected with the first additional impedance. In this case, impedance mismatch may occur due to the connected first additional impedance, but a degree of mismatch is identical in both the unit modulation circuitries 212 and 214, such that signal power backscattered through each antenna is identical.

Further, in the case where an encoding signal is '00', such that '0' is allocated to both the first transmission signal $TX_{01}$ and the second transmission signal $TX_{02}$, the impedance control unit 216 controls both the tag input impedances of the unit modulation circuitries 212 and 214 to be the base impedance connected with the second additional impedance. In this case, the second additional impedance has a value different from that of the first additional impedance. In the case where additional impedances have different values, signal power backscattered through each antenna may be different, such that the RFID reader may differentiate between encoding signals '01' and '10' or '11'.

For example, the first additional impedance and the second additional impedance may be designed such that signal power backscattered through each of the antennas ANT1 and ANT2 in the case where an encoding signal is '11' may be two times signal power backscattered through each of the antennas ANT1 and ANT2 in the case where an encoding signal is '01' or '10'. However, the present disclosure is not limited thereto, and the first additional impedance and the second additional impedance may be designed in other manners as long as the RFID reader may recognize a difference in signal power backscattered through the antennas ANT1 and ANT2, the difference being caused by the values of additional impedance connected with the base impedance.

Figure 4:
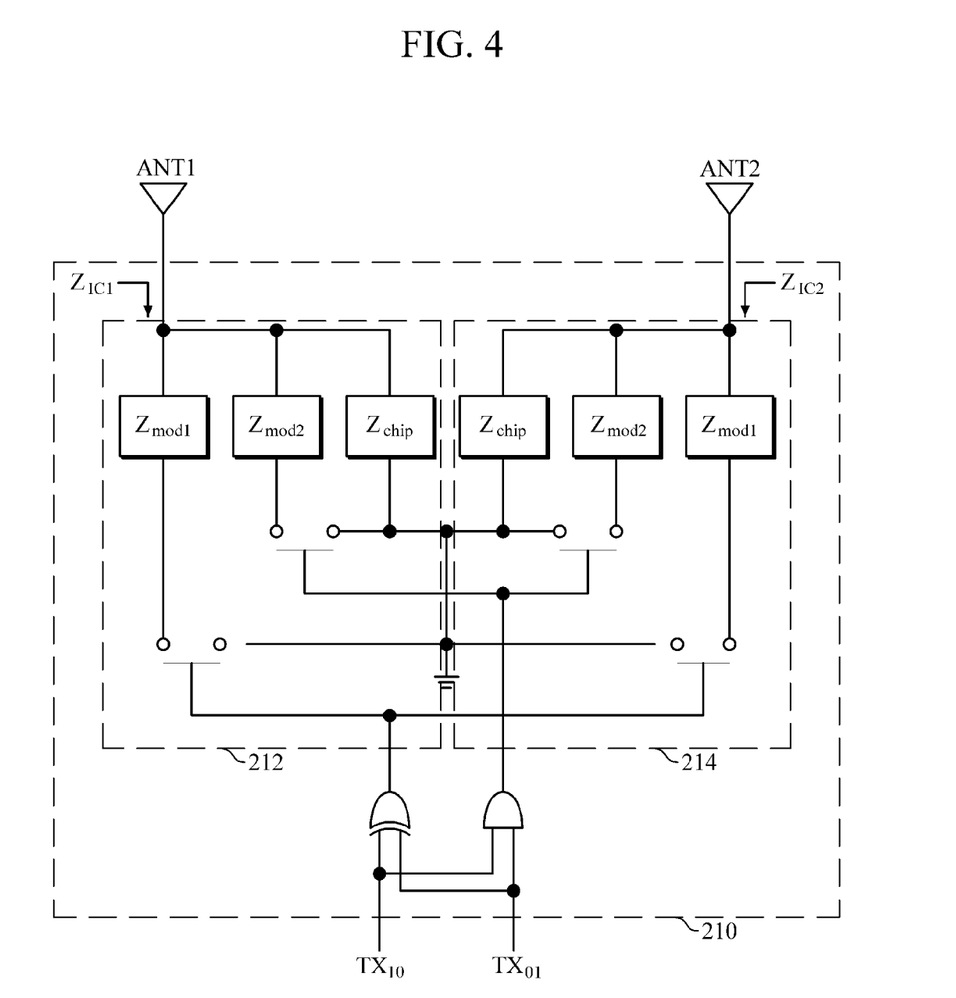
FIG. 4 is a diagram illustrating a circuit of a dual antenna backscattering modulator in the dual antenna FRID tag illustrated in FIG. 3.

FIG. 4 is a diagram illustrating a circuit of a dual antenna backscattering modulator in the dual antenna FRID tag illustrated in FIG. 3. The modulator 210 illustrated in FIG. 4 is different from the modulator illustrated in FIG. 2 in that the modulator 210 of FIG. 4 includes two additional impedances $Z_{mod1}$ and $Z_{mod2}$ which have different values from each other, and a base impedance $Z_{mod}$ which is indirectly connected with the digital and memory circuitry 220 (see FIG. 2).

Referring to FIG. 4, the modulator 210 includes a first unit modulation circuitry 212 and a second unit modulation circuitry 214 that are connected with two antennas ANT1 and ANT 2, respectively. As described above, the first unit modulation circuitry 212 and the second unit modulation circuitry 214 are configured in the same manner, in which the first unit modulation circuitry 212 is connected with the first antenna ANT1, and the second unit modulation circuitry 214 is connected with the second antenna ANT2. Further, a tag input impedance of the first unit modulation circuitry 212 is $Z_{IC1}$, and a tag input impedance of the second unit modulation circuitry 214 is $Z_{IC2}$. Each of the unit modulation circuitries 212 and 214 includes two additional impedances $Z_{mod1}$ and $Z_{mod2}$ that may be connected in parallel with a base impedance $Z_{chip}$.

The modulator 210 may also include an impedance control unit 216. Depending on the types of encoding signals, i.e., values allocated to each of the transmission signals $TX_{10}$ and $TX_{01}$, the impedance control unit 216 may control whether additional impedances are connected with the base impedance, or if additional impedances are connected, the impedance control unit 216 may control which additional impedance is connected. FIG. 4 illustrates an example of such impedance control unit 216, the configuration of which may be varied as long as the impedance control unit 216 is configured to perform the following operations.

The modulator 210 illustrated in FIG. 4 is configured to operate as follows.

In the case where an encoding signal is '00', such that both the first and the second transmission signals $TX_{10}$ and $TX_{01}$ are '0', tag input impedances $Z_{IC1}$ and $Z_{IC2}$ of each of the unit modulation circuitry 212 and the second unit modulation circuitry 214 are all the base impedance $Z_{chip}$. That is, no additional impedances are connected with all the impedances of each RFID tag chip, such that impedance matching may be maintained. Based on a backscattered uplink signal while maintaining impedance matching, the RFID reader may recognize that an uplink signal is '00'.

Then, in the case where an encoding signal is '01' or '10', such that any one of the first and the second transmission signals $TX_{10}$ and $TX_{01}$ is '0', and the other is '1', tag input impedances $Z_{IC1}$ and $Z_{IC2}$ of each of the first unit modulation circuitry 212 and the second unit modulation circuitry 214 are $Z_{chip}//Z_{mod1}$, respectively. That is, all the impedances of each RFID tag chip are values obtained by connecting the first additional impedance $Z_{mod1}$ in parallel with the base impedance $Z_{chip}$. As a result, signal power backscattered through the first antenna ANT1 and the second antenna ANT2 is determined according to the value of the first additional impedance $Z_{mod1}$. According to a backscattered uplink signal power determined according to the value of the first additional impedance $Z_{mod1}$, the RFID reader may recognize that an uplink signal is either '01' or '10'. In addition, the RFID reader may differentiate between signals '01' and '10' according to a predetermined protocol of an RFID system. Further, since signal power backscattered through both the antennas ANT1 and ANT2 is equal, the RFID reader may accurately recognize an uplink signal even if the antennas ANT1 and ANT2 are in different radio wave or reception environments.

Further, in the case where an encoding signal is '11', such that both the first and the second transmission signals $TX_{10}$ and $TX_{01}$ are '1', tag input impedances $Z_{IC1}$ and $Z_{IC2}$ of the first unit modulation circuitry 212 and the second unit modulation circuitry 214 are $Z_{chip}//Z_{mod2}$, respectively. That is, all the impedances of each RFID tag chip are values obtained by connecting the second additional impedance $Z_{mod2}$ in parallel to the base impedance $Z_{chip}$. As a result, signal power backscattered through the first antenna ANT1 and the second antenna ANT2 determined according to the value of the second additional impedance $Z_{mod2}$. According to a backscattered uplink signal power determined according to the value of the second additional impedance $Z_{mod2}$, the RFID reader may recognize that an uplink signal is '11'. Further, since signal power backscattered through both the antennas ANT1 and ANT2 is equal, the RFID reader may accurately recognize an uplink signal even if the antennas ANT1 and ANT2 are in different radio wave or reception environments. Operations of the modulator 210 according to the embodiment of the present disclosure are shown in Table 2 below.

TABLE 2

| TX10 | TX01 | $Z_{IC1}$ | $Z_{IC2}$ |
|---|---|---|---|
| 0 | 0 | | Zchip |
| 1 | 0 | | Zmod1//Zchip |
| 0 | 1 | | |
| 1 | 1 | | Zmod2//Zchip |

In order for the modulator illustrated in FIG. 4 to achieve the same performance as that of the modulator illustrated in FIG. 2, the reflection coefficient calculated by $Z_{chip}//Z_{mod}$ is required to be four times greater than that calculated by $Z_{mod1}//Z_{chip}$, and is required to be the same as that calculated by $Z_{mod2}//Z_{chip}$. This is because backscattered signal power is proportional to the square of the reflection coefficient.

Hereinafter, operations of an RFID tag including the modulator according to the present disclosure will be described in further detail by using, as a dual-antenna RFID tag, an RFID system of an Amplitude Shift Keying (ASK) modulation scheme. As described above, in the dual-antenna RFID tag, four types of encoding signals '00', '01', '10', and '11' may be input bit by bit to the modulator 210 as transmission signals $TX_{10}$ and $TX_{01}$. The simplest method in the dual ASK modulation scheme is to maximize (M) or minimize (m) backscattered power in each antenna depending on whether the transmission signals $TX_{10}$ and $TX_{01}$ are '0' or '1'. When encoding signals '00', '01', '10', and '11' are input to the modulator 210 as transmission signals $TX_{10}$ and $TX_{01}$, the backscattered power may be mm-(M/2)(M/2)-(M/2)(M/2)-MM. The RFID reader may sense the signals as three types of uplink signals. Further, the RFID reader may differentiate between signals '01' and '10', which have the same power, according to a predetermined protocol in the RFID system.

As described above with reference to FIG. 2, there may be two different radio wave environments in the RFID system. For example, if the second antenna ANT2 is in a relatively bad radio wave or reception environment as compared to a first antenna ANT1, the RFID reader may not accurately sense a signal power backscattered through the second antenna ANT2. As a result, when encoding signals '00', '01', '10', and '11' are input to a modulator as transmission signals $TX_{10}$ and $TX_{01}$, the backscattered power sensed by the RFID reader is mm-(M/2)m-(M/2)m-Mm. In spite of 3-dB power decrement, the RFID reader may distinguish three types of information, such that a recognition error does not occur.

As described above, the RFID tag operates such that the power of an uplink signal backscattered through each of the multiple antennas is identical regardless of the types of encoding signals. Accordingly, even when a specific antenna, among a plurality of antennas, is in a bad radio wave or reception environment, the RFID tag may transmit a backscattered signal with equal power. As a result, even when antennas are in different radio wave environments with some antennas being in a bad radio wave environment, the RFID reader may accurately recognize an uplink signal.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A Radio Frequency Identification (RFID) tag, comprising:
    a plurality of antennas each configured to backscatter received Radio Frequency (RF) signals;
    a digital and memory circuitry, which once the RF signals are received through the plurality of antennas, is configured to generate a series of programmed encoding signals based on identification information to be transmitted, and to output the generated signals; and
    a modulator configured to vary power of an uplink signal backscattered through the plurality of antennas based on the encoding signals input from the digital and memory circuitry,
    wherein the modulator operates such that the power of the uplink signal backscattered through each of the plurality of antennas is equal regardless of types of the encoding signals.

2. The RFID tag of claim 1, wherein the modulator operates to vary the power of the uplink signal backscattered through the plurality of antennas according to the input encoding signals.

3. The RFID tag of claim 2, wherein the modulator is connected with each of the plurality of antennas, and comprises a plurality of variable impedance circuits having different impedances.

4. The RFID tag of claim 3, wherein each of the plurality of variable impedance circuits comprises:
    a plurality of additional impedance elements, which have different values from each other and are capable of being connected in parallel to a base impedance element of the tag; and
    a switching device configured to control each of the plurality of additional impedance elements to be connected to the base impedance element.

5. The RFID tag of claim 1, wherein an Amplitude Shift Keying (ASK) modulation scheme is applied to the modulator.

6. The RFID tag of claim 1, wherein the plurality of antennas are two in number, and the encoding signals are 2-bit signals.

7. The RFID tag of claim 6, wherein the modulator comprises two variable impedance circuits which are connected to each of the two antennas to vary the power of the uplink signal backscattered through the plurality of antennas according to the input encoding signals.

8. The RFID tag of claim 7, wherein each of the two variable impedance circuits comprises:
    two additional impedance elements, which have different values from each other and are capable of being connected in parallel to a base impedance element of the tag; and
    a switching device configured to control each of the two additional impedance elements to be connected to the base impedance element.

9. The RFID tag of claim 8, wherein in response to the encoding signal being '01' or '10', the switching device controls a first additional impedance element, among the two additional impedance elements, to be connected in parallel with the base impedance element.

10. The RFID tag of claim 9, wherein in response to the encoding signal being '11', the switching device controls a second impedance element, among the two additional impedance elements, to be connected in parallel with the base impedance element.

11. A Radio Frequency Identification (RFID) tag having a plurality of antennas, the tag comprising:
    a first antenna and a second antenna each configured to backscatter respective received Radio Frequency (RF) signals;
    a modulator configured to comprises a first unit modulation circuitry configured to be electrically connected to the first antenna to vary power of an uplink signal backscattered through the first antenna, and a second unit modulation circuitry configured to be electrically connected to the second antenna to vary power of an uplink signal backscattered through the second antenna; and
    a digital and memory circuitry, which once the RF signals are received through the first and the second antennas, is configured to generate a series of encoding signals with identification information to be transmitted being encoded therein, and to output the generated signals,
    wherein the modulator operates such that the power of the uplink signal backscattered through each of the first and the second antennas is equal regardless of types of the encoding signals.

12. The RFID tag of claim 11, wherein an Amplitude Shift Keying (ASK) modulation scheme is applied to the modulator.

13. The RFID tag of claim 12, wherein each of the first and the second unit modulation circuitries comprises two variable impedance circuits to vary the power of the uplink signal backscattered through the first and the second antennas according to input encoding signals.

14. The RFID tag of claim 13, wherein each of the two variable impedance circuits comprises:
    two additional impedance elements, which have different values from each other and are capable of being connected in parallel to a base impedance element of the tag; and
    a switching device configured to control each of the two additional impedance elements to be connected to the base impedance element.

15. The RFID tag of claim 14, wherein in response to the encoding signal being '01' or '10', the switching device controls a first additional impedance element, among the two additional impedance elements, to be connected in parallel with the base impedance element.

16. The RFID tag of claim 15, wherein in response to the encoding signal being '11', the switching device controls a second impedance element, among the two additional impedance elements, to be connected in parallel with the base impedance element.

* * * * *

UNITED STATES PATENT AND TRADEMARK OFFICE
CERTIFICATE OF CORRECTION

PATENT NO.       : 9,514,402 B1
APPLICATION NO.  : 14/947750
DATED            : December 6, 2016
INVENTOR(S)      : Hyun Seok Kim et al.

It is certified that error appears in the above-identified patent and that said Letters Patent is hereby corrected as shown below:

Item (73) Assignee
Change "ELECTRONICS AND TELECOMMUNICATIONS RESEARCH INSTIT" TO "ELECTRONICS AND TELECOMMUNICATIONS RESEARCH INSTITUTE"

Signed and Sealed this
Ninth Day of May, 2017

Michelle K. Lee
*Director of the United States Patent and Trademark Office*